US009257666B2

(12) United States Patent
Sirringhaus et al.

(10) Patent No.: US 9,257,666 B2
(45) Date of Patent: Feb. 9, 2016

(54) OPTOELECTRONIC DEVICES

(75) Inventors: Henning Sirringhaus, Cambridge (GB);
Michael C. Gwinner, Balingen (DE);
Harald Giessen, Mannheim (DE);
Heinz Clemens Schweizer, Stuttgart (DE)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 1001 days.

(21) Appl. No.: 13/127,456

(22) PCT Filed: Nov. 26, 2009

(86) PCT No.: PCT/GB2009/051601
§ 371 (c)(1),
(2), (4) Date: Jun. 7, 2011

(87) PCT Pub. No.: WO2010/064028
PCT Pub. Date: Jun. 10, 2010

(65) Prior Publication Data
US 2011/0229073 A1    Sep. 22, 2011

(30) Foreign Application Priority Data
Dec. 2, 2008  (GB) .................................. 0821980.0

(51) Int. Cl.
*G02B 6/12*   (2006.01)
*H01L 51/52*  (2006.01)
(Continued)

(52) U.S. Cl.
CPC ........ *H01L 51/5203* (2013.01); *H01L 51/0558* (2013.01); *H01L 51/5275* (2013.01);
(Continued)

(58) Field of Classification Search
CPC ............ H01L 51/0508; H01L 51/0512; H01L 51/0541; H01L 51/0545; H01L 51/0558; H01L 51/0562; H01L 51/0566; H01L 51/0583; H01L 51/4213; H01L 51/50; H01L 51/5296
USPC ............. 385/14; 438/22, 99; 257/40, 81, 103, 257/347, 350
See application file for complete search history.

(56) References Cited

U.S. PATENT DOCUMENTS 5,633,512 A * 5/1997 Okuda et al. ..................... 257/20
6,828,583 B2 * 12/2004 Heeger et al. ................... 257/40
(Continued)

FOREIGN PATENT DOCUMENTS

CH          635603       4/1983

OTHER PUBLICATIONS

Baumann et al "Organic Mixed-Order Photonic Crystal Lasers with Ultrasmall Footprint" Applied Physics Letters, AIP vol. 91, No. 17 Oct. 24, 2007.

(Continued)

*Primary Examiner* — Kaveh Kianni
*Assistant Examiner* — Guy Anderson
(74) *Attorney, Agent, or Firm* — Hamilton DeSanctis & Cha

(57) ABSTRACT

The present invention relates integrated optoelectronic devices comprising light emitting field-effect transistors. We describe an optoelectronic device comprising a light-emitting field effect transistor (LFET) with an organic semiconductor active layer and a waveguide integrated within the channel of the light-emitting field effect transistor, wherein said waveguide comprises a material which has a higher refractive index than said organic semiconductor. We also describe a light-emitting organic field transistor integrated with a ridge or rib waveguide incorporated within the channel of the LFET; and a similar light-emitting organic field effect transistor in which the waveguide incorporates an optical feedback mechanism.

17 Claims, 11 Drawing Sheets

(51) Int. Cl.
*H01S 5/36* (2006.01)
*H01L 51/05* (2006.01)
*H01S 5/10* (2006.01)
*H01S 5/12* (2006.01)
*H01S 5/187* (2006.01)
*H01S 5/22* (2006.01)
*H01S 5/30* (2006.01)

(52) U.S. Cl.
CPC .............. *H01S 5/36* (2013.01); *H01L 51/0508* (2013.01); *H01L 51/0512* (2013.01); *H01L 51/0541* (2013.01); *H01L 51/0545* (2013.01); *H01L 51/0562* (2013.01); *H01L 51/0566* (2013.01); *H01L 51/0583* (2013.01); *H01S 5/105* (2013.01); *H01S 5/12* (2013.01); *H01S 5/187* (2013.01); *H01S 5/22* (2013.01); *H01S 5/3004* (2013.01)

(56) References Cited

U.S. PATENT DOCUMENTS

| | | | |
|---|---|---|---|
| 6,943,359 | B2* | 9/2005 | Vardeny et al. ............ 250/492.2 |
| 7,272,275 | B2* | 9/2007 | Spoonhower et al. ........... 385/15 |
| 7,531,832 | B2* | 5/2009 | Tada et al. ........................ 257/40 |
| 7,638,793 | B2* | 12/2009 | Chua et al. ....................... 257/40 |
| 2002/0014660 | A1 | 2/2002 | Noble et al. |
| 2003/0047729 | A1* | 3/2003 | Hirai et al. ...................... 257/40 |
| 2003/0160235 | A1* | 8/2003 | Hirai ............................... 257/40 |
| 2004/0065877 | A1* | 4/2004 | Hayashi et al. ................. 257/40 |
| 2004/0113098 | A1* | 6/2004 | Vardeny et al. ............ 250/492.2 |
| 2004/0206959 | A1* | 10/2004 | Heeger et al. ................... 257/72 |
| 2006/0214156 | A1* | 9/2006 | Pan et al. ........................ 257/40 |
| 2006/0291769 | A1* | 12/2006 | Spoonhower et al. ........... 385/14 |
| 2007/0178478 | A1 | 8/2007 | Dhallan |
| 2007/0278478 | A1* | 12/2007 | Zaumseil et al. ............... 257/40 |
| 2007/0295955 | A1* | 12/2007 | Chua et al. ...................... 257/40 |
| 2008/0128688 | A1* | 6/2008 | Pan et al. ........................ 257/40 |
| 2011/0229073 | A1* | 9/2011 | Sirringhaus et al. ............ 385/14 |

OTHER PUBLICATIONS

Golka et al "Quantum Cascade Lasers with Lateral Double-Sided distributed Feedback Grating" Applied Physics Letters AIP vol. 86 No. 11 Mar. 7, 2005.

Gwinner et al "Integration of a Rib Waveguide Distributed Feedback Structure into a Light-Emitting Polymer Field-Effect Transistor" Adv. Functional Mater., vol. 19, No. 9 Sep. 2009.

Gwinner et al "Simultaneous Optimization of Light Gain and Charge Transport in Ambipolar Field-Effect Transistors" Chemistry of Materials vol. 21 No. 19 Oct. 13, 2009.

Harbers et al "Enhanced Feedback in Organic Photonic-Crystal Lasers" Applied Physics Letters vol. 87 2005.

Naber et al "A Gate Dielectric that Enables High Ambipolar Mobilities in Polymer Light-Emitting Field-Effect Transistors" Applied Physics Letters vol. 93 2008.

Pauchard M et al "Optical Amplification of the Cutoff Mode in Planar Asymmetric Polymer Waveguides" Applied Physics Letters, vol. 83 No. 22 Dec. 1, 2003.

Swensen et al "Light emission from an Ambipolar Semiconducting Polymer Field Effect Transistor: analysis of the Device Pysics" Journal of Applied Physics vol. 102 No. 1 Jul. 5, 2007.

Samuel et al "Organic Semiconductor Lasers" Chem Rev. 2007 pp. 1272-1295.

Xia et al "Polyfluorene Distributed Feedback Lasers Operating in the Green-Yellow Spectral Region" Applied Physics Letters Jul. 11, 2005.

Yap et al "Simultaneous Optimization of Charge-Carrier Mobility and Optical Gain in Semiconducting Polymer Films" Published online Apr. 13, 2008 Nature Publishing group vol. 7 May 2008.

Zaumsiel et al "Spatial Control of the Recombination Zone in an Ambipolar Light-Emitting Organic Transistor" Published online Dec. 18, 2005 Nature Publishing Group vol. 5 Jan. 2006.

* cited by examiner

A

B (A)

(B)

(C)

(A)

(B)

(C)

(A)

(B)

(C)

(A)

(B)

(C)

(A)

(B)

(C)

OPTOELECTRONIC DEVICES

CROSS REFERENCE TO RELATED APPLICATION

This application is the United States national stage filing of PCT/GB2009/051601 entitled "Optoelectronic Devices" and filed Nov. 26, 2009; which claims priority to Great Britain Patent Application GB0821980.0 filed Dec. 2, 2008. Each of the aforementioned applications are incorporated herein by reference for all purposes.

BACKGROUND OF THE INVENTION

This invention relates to integrated optoelectronic devices comprising light-emitting field-effect transistors.

Organic electronic devices, such as light-emitting diodes, solar cells and field-effect transistors have become of interest for a range of applications in displays and electronics. Organic LEDs have advanced to become one of the most efficient light sources available, organic photodetectors and organic solar cells are capable of near 100% quantum efficiencies, organic-based biological, chemical and mechanical sensors and memory devices are being developed for a range of different applications. A recognized strength of organic devices is the ease with which different device functionalities can be integrated in a common materials platform. All these functionalities can in principle be realized using similar materials than can be processed using a common set of manufacturing technologies. Therefore, integration of multifunctional devices on a common substrate is simpler than, for example, for silicon based devices.

There is particular interest in integration of information processing functions realized used transistor devices and optical function with light generated by LEDs and detected by photodetectors. Integration of optical and electronic functions could be used in optoelectronic integrated circuits, in which a light signal that is generated in response to the outcome of some computations is coupled into a waveguide structure and send to a spatially separate part of the system in which it is detected and initiates another information processing function.

Similarly, electrically pumped lasing devices are of interest in which an electrically stimulated gain medium is incorporated into an optical feedback structure to achieve coherent light generation of well-defined wavelength by stimulating the emission of the gain medium. Electrically pumped lasers using organic semiconductors have not been realized yet, although optically pumped lasing has been achieved in a number of systems (Samuel, Chem. Rev. 107, 1272 (2007)). The reasons for this are related to additional optical losses that arc present when electrical pumping is used, due to presence of electrodes (losses due to absorption of light in electrodes), charge-carrier induced absorptions as well as presence of triplet states. At present no device architecture has been proven to be suitable realization of an electrically pumped organic semiconductor laser.

A common architecture for optically pumped organic lasers are distributed feedback (DFB) structures (Samuel, Chem. Rev. 107, 1272 (2007)), in which a 1-D or 2D periodic grating structure is integrated together with a film of an organic gain medium. Most DFB lasers reported in the literature so far are mostly etched into the glass substrate, and their feedback thus relies on the index contrast between the glass and the organic gain material deposited on top. A promising alternative approach is to include a thin layer of a material with a large refractive index (e.g, tantalum pentoxide $Ta_2O_5$, n=2.07) comprising the required feedback pattern, onto which the organic material is deposited (Harbers, Appl. Phys. Letters 87, 151 121 (2005)).

However, the aforementioned are limited and there exists a need in the art for additional improvements.

BRIEF DESCRIPTION OF THE DRAWINGS

These and other aspects of the invention will now be further described, by way of example only, with reference to the accompanying figures in which.

BRIEF SUMMARY OF THE INVENTION

Figure 1:
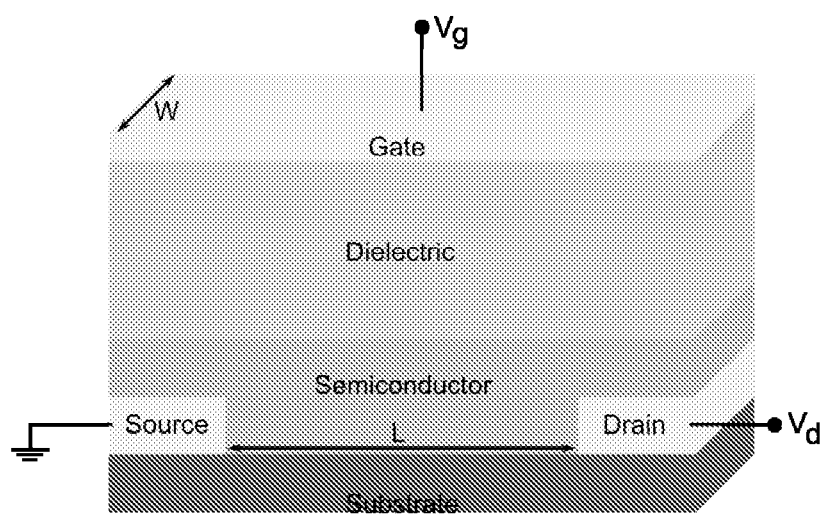
FIG. 1 shows a top-gate architecture for an ambipolar LFET according to the prior art (A) and an image of the optical emission from the recombination zone in the channel of the device.
Figure 1:
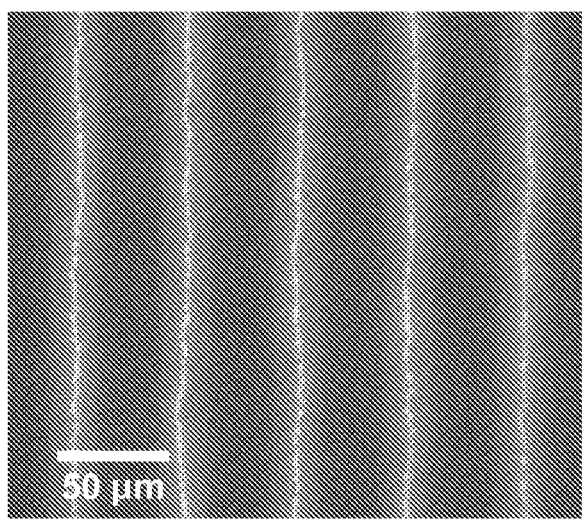

This invention relates to integrated optoelectronic devices comprising light-emitting field-effect transistors.

In one or more embodiments of the present invention, there is provided a light-emitting organic field transistor integrated with a ridge or rib waveguide incorporated within the channel of the LFET.

In preferred embodiments the recombination zone in the LFET is placed on top of the waveguide using suitable voltage conditions and the light emitted from the recombination zone of the LFET is coupled into the waveguide. Then in embodiments the light is waveguided along the waveguide, either to a spatially separate part of the device where, for example, it is detected by a photodetector, or say to a suitable structure for outcoupling of the light into free space. The light emitted in tile waveguide can be modulated by either turning ON and OFF the LFET or by moving the recombination zone, for example positioning the recombination zone away from the waveguide structure in the channel by using an applied bias (source-drain, gate voltages).

Some embodiments of the present invention provide a light-emitting organic field transistor integrated with a high refractive index ridge or rib waveguide incorporated within the channel of the LFET, wherein said waveguide also has an optical feedback incorporated.

Thus in embodiments the waveguide is configured to provide an optical feedback mechanism. The waveguide structure can be formed, for example, from a high n-material such as $TiO_2$ or $Ta_2O_5$. The optical Feedback structure may be a 1D or 2D DFB grating to modify the optical transmission of guided modes in the waveguide. The optoelectronic device may, for example, be operated as a lasing device, wherein electrical pumping is provided by the ambipolar current of the LFET. The proposed architecture provides efficient optical feedback, and thus lasing thresholds are lowered. This is because the effective index of the laser mode is raised, as the mode is more tightly confined in the hybrid waveguide formed by the high-index material and the organic gain material. The structure also provides more effective confinement of the light than what would be achievable with the organic semiconductor alone, and this is beneficial as it reduces optical losses from the electrodes of the device, and allows, for example, the use of thinner gate dielectrics.

Some embodiments of the present invention further provide an optoelectronic device comprising a light-emitting field transistor (LFET) with an organic semiconductor active layer and a waveguide integrated within the channel of the light-emitting field-effect transistor, wherein said waveguide comprises a material which has a higher refractive index (at a wavelength of the emitted light) than said organic semiconductor.

In embodiments the voltages applied to the LFET are selected such that the recombination zone of the LFET is located at least partially on top of the waveguide so as to allow efficient incoupling of light into the waveguide. Preferably the waveguide also comprises an optical feedback structure, in particular a distributed feedback (DFB) structure, to modify the transmission of light travelling in the waveguide. Then the materials and dimensions of the waveguide structure axe preferably selected such that the Bragg condition for the DEB structure is fulfilled at a wavelength close or substantially equal to the maximum gain of the organic semiconductor. In embodiments the waveguide is fabricated from a high-k inorganic oxide (a material with a higher dielectric constant ($\kappa$) than silicon dioxide).

The device may be a lasing device; the 11 the pumping of the lasing device may be achieved electrically through the current flowing between the source and drain electrodes of the LFET. A detector, in particular organic photodiode or a phototransistor, may be included, spaced apart from the LFET, to detect the light emitted from the LFET into the waveguide.

In embodiments the thickness and dimensions of the individual layers of the LFET and of the waveguide are chosen to achieve incoupling of the light emitted from the LFET into the waveguide, and preferably optimized also to simultaneously achieve (i) low optical losses, and (ii) high LFET current.

In various embodiments of the present invention, a fabrication method for the LFET described above is provide, with an organic semiconductor active layer and a waveguide integrated within the channel of the light-emitting field-effect transistor, in which thickness and dimensions of the individual layers of the LFET and of the waveguide are chosen to achieve incoupling of the light emitted from the LFET into the waveguide, and preferably also optimized to simultaneously achieve (i) low optical losses, and (ii) high LFET current.

Various embodiments of the present invention provide a semiconductor laser comprising a light-emitting field effect transistor (LFET), the LFET having a channel which, in operation, conducts charge carriers of two types of opposite polarity, a waveguide optically coupled to said channel of said LFET, and a light reflector configured to provide an optical cavity for said laser.

In embodiments the optical feedback mechanism or light reflector or above described optical feedback mechanism may comprise a distributed feedback structure with a period which substantially matches a second-order Bragg condition for a particular wavelength adjacent a gain maximum of the LFET or laser. Optionally the device may be configured to support multiple resonant modes at different wavelengths simultaneously.

One or more embodiments of the present invention provide a method of coupling light into a waveguide, using a light emitting field effect transistor (LFET), the LFET having a channel conducting charge carriers of two types of opposite polarity, the method comprising providing a waveguide adjacent or within the channel of the LFET, and biasing the LFET to control a location of recombination of said opposite polarity charge carriers such that light from said recombination is coupled into said waveguide.

Some embodiments of the present invention further provide an optoelectronics integrated circuit comprising a substrate bearing a light-emitting field effect transistor (LFET) in which a channel of said field effect transistor incorporates a waveguide.

In some cases, LFET, laser, integrated circuit or method as described above the a light-emitting field transistor (LFET) is a top gate transistor. In various cases, the light-emitting field transistor (LFET), whether or not a top-gate device, has a gate electrode comprising silver gate metal.

In this specification, "light" encompasses both visible and non-visible light (infrared and, potentially, ultraviolet light). Thus, for example, visible light may be taken to comprise light between 380 nm and 750 nm, infrared light may be taken to comprise light between roughly 750 n1n to 300 pm, and ultraviolet light may be taken to comprise light with a wavelength shorter than 380 m.

This summary provides only a general outline of some embodiments of the invention. Many other objects, features, advantages and other embodiments of the invention will become more fully apparent from the following detailed description, the appended claims and the accompanying drawings.

DETAILED DESCRIPTION

This invention relates to integrated optoelectronic devices comprising light-emitting field-effect transistors.

We have recently been able to demonstrate a new optoelectronic device architecture for generating light within ambipolar field-effect transistors. The structure will in the following be referred to as a light-emitting organic field-effect transistor (LFET) (Zaumseil et al, Nature Materials 5, 69 (2006), Zaumseil, et al. Adv. Funct. Materials 18, 2708 (2006), EP 05701898.8), the entire content of which are herewith included in the present application. In an ambipolar LFET, under suitable biasing conditions both electron and hole accumulation layers are simultaneously formed in the channel. At the boundary between the electron and hole accumulation region recombination occurs and emission of light is observed. It is possible to move the recombination zone across the entire channel length by varying the applied biasing conditions. (For example with source=0V, drain=Vsd and gate=Vsd/2 the recombination tales place approximately in the middle of the channel; by varying the gate voltage the position can be moved towards the source or drain). Such devices are beautiful manifestations of the clean ambipolar charge transport properties that can be observed in organic semiconductors when using suitable gate dielectrics and device configurations. However, as shown in the present invention they are also a very suitable architecture for efficiently coupling light into optical waveguide structures as well as for realization of electrically pumped organic semiconductor lasers.

The device structure we propose can be realized in either a top gate LFET architecture as shown in FIG. 1, or in a bottom-gate architecture as demonstrated, for example, in Zaumseil et al, Nature Materials 5, 69 (2006). In the following we exemplify this for the top-gate architecture.

Figure 2:
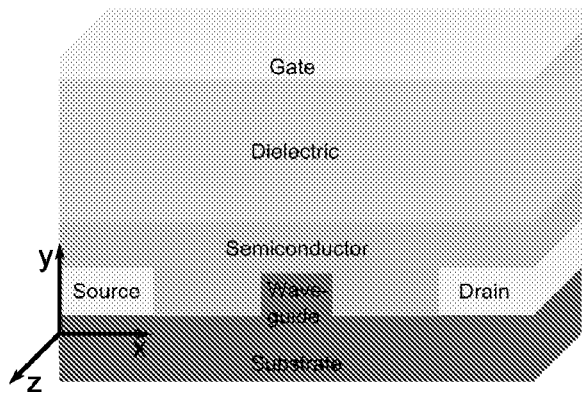
FIG. 2 shows a LFET integrated with a rib waveguide (A) and simulation of the waveguided optical mode profile in the rib waveguide structure (B) and in the LFET structure shown in FIG. 1.
Figure 2:
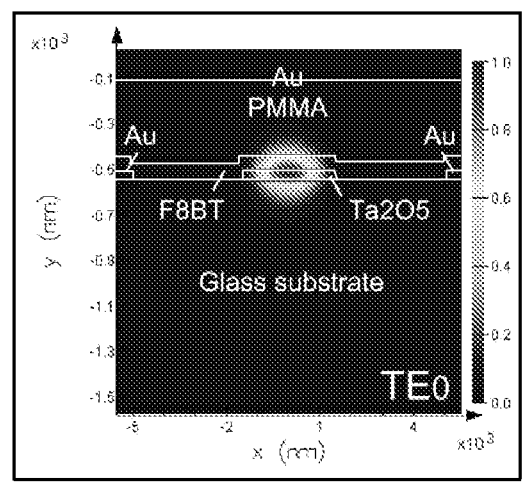
Figure 2:
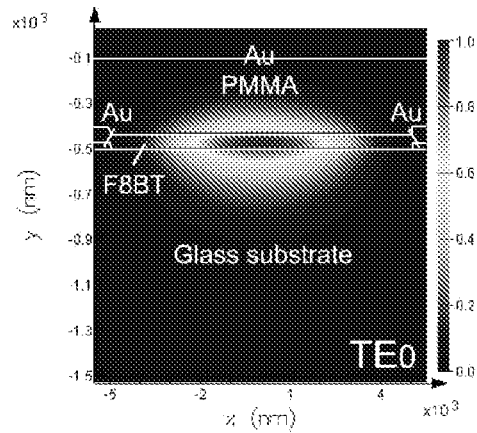

FIG. 2(A) shows the architecture of our device. The device is built on a suitable substrate such as glass, $Si/SiO_2$, or a flexible substrate. A high index rib or ridge waveguide structure is deposited and patterned on the substrate. Suitable materials for the waveguide are high k inorganic or organic materials (high k may be taken as, in particular, a higher dielectric constant than greater than silicon dioxide). A preferred choice is $Ta_2O_5$ or $TiO_2$ due to their good optical quality and low optical losses. Metal source-drain electrodes are defined by a patterning process such as photolithography or direct printing, such that the edges of the electrodes are aligned with respect to the waveguide and the waveguide is located within the channel defined by the source-drain electrodes. Preferably, the waveguide has a linear dimension and is aligned parallel to the edge of the electrodes. The waveguide may extend beyond the source-drain electrode structure to a separate portion of the substrate where a detector may be located or to the edge of the substrate, where the light can easily be outcoupled. The metals used for source and drain electrodes can either be selected to be the same or different. The first choice is simpler to manufacture, but the second choice enables using different workfunction metals in order to separately inject of electrons and holes from respective electrodes. On top of the waveguide and source-drain electrode structure an active organic semiconducting layer is deposited. The organic semiconductor may comprise a semiconducting polymer, or a small molecule organic semiconductor. Preferably, the organic semiconductor is selected to exhibit both a high electron and hole mobility, preferably higher than loM3c m2ns and more preferably higher than $10^{-2}$ $cm^2/Vs$, for both electrons and holes, and a high photoluminescence efficiency, preferably higher than 50%. A suitable choice for such a semiconductor is poly-dioctyl-fluorene-co-bithiophene (F8BT). On top of the organic semiconductor a gate dielectric is deposited. A suitable choice for the gate dielectric is PMMA or polycyclohexylethylene. Finally, a gate electrode is deposited on top.

The ambipolar LEFET with F8BT as active material emits light due to charge recombination within the channel. As electron and hole transport are fairly balanced, this recombination zone is roughly in the middle of f the channel if the device is biased appropriately. The light can couple into a TE mode within the F8BT. However, without the waveguide the light is not efficiently guided (FIG. 2C). With the incorporation of an additional waveguide rib, comprising an insulating material with high refractive index such as $Ta_2O_5$, the emitted light is more efficiently coupled into the waveguide mode by aligning the ridge to the recombination zone of the LEFET (FIG. 2B). The width of the ridge is designed to match the one of the recombination zone (2-3 μm).

Figure 3:
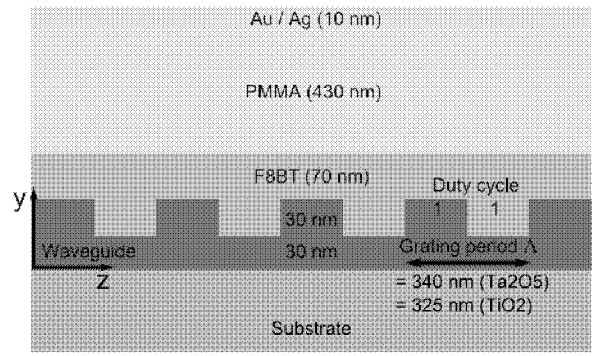
FIG. 3 shows a DFB structure integrated into the waveguide: Schematic diagram (A), AFM topograph (B) and SEM (C) of source-drain electrode and waveguide structure.
Figure 3:
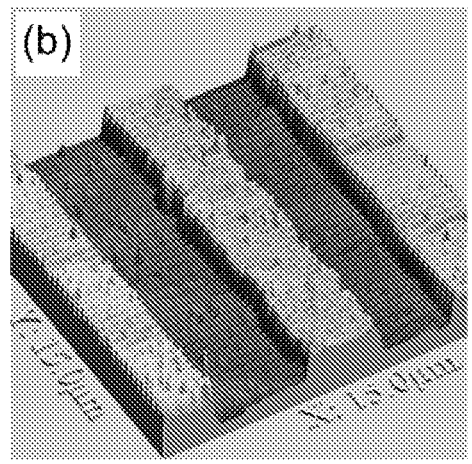
Figure 3:
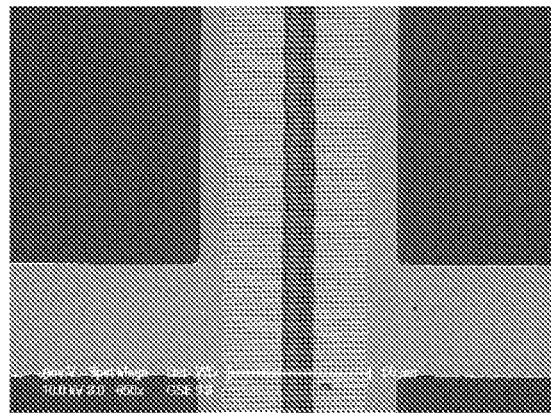

FIG. 3 shows a DFB structure integrated with the waveguide. The feedback structure for the emitted light comprises a one-dimensional DFB grating perpendicular to the ridge, which is made of the same material. For fabrication reasons, it is chosen here to be wider than the channel and reaches beneath the gold electrodes. The grating induces distributed reflection of the light waveguided parallel to the ridge. The DFB grating can be either selected to be first order or of higher order with respect to the targeted emission wavelength. The DFB period in the respective structures is chosen here to match the second-order Bragg condition for a particular wavelength around the gain maximum of F8BT (560-570 nm). The second-order grating design exhibits considerable fabrication advantages over first-order edge emission. Glass substrate edges are always imperfect, and spin-coating of the polymer causes severe thickness variations at the edges. Despite second-order vertical emission, pointed light emission through the substrate edges in direction of the waveguide ridge is observed as well. For practical reasons, however, the light is detected on top or bottom.

One of the most delicate processing steps is the alignment of the waveguide ridge (typically 3 μm wide) into the middle of a transistor channel (L=10 μm), which is defined via T-shaped source I drain electrodes made of gold (W=5 mm). For devices with feedback structure, the ridge itself is positioned in the middle of a 50 μm wide and 3 mm long DEB grating.

Whereas optical microscopy allows for checking the alignment, higher resolutions and thus a view of the fine-structure of the feedback architecture can be obtained with Environmental SEM. FIG. 3C presents an ESEM image of the transistor channel region of the T-shaped electrode pattern, The close-up view confirms the excellent homogeneity of the grating with a period of around 340 μm. Minor dimension variations are blamed on the fact that the ridge width approached the minimal dimensions possible with the photolithography system, and therefore causes deviations during the exposure. Moreover, $Ta_2O_5$ tends to redeposit during the lift-off processes due to its granularity and stickiness.

In order to control the individual feature thicknesses, topography images are taken via AFM (FIG. 3B). A profile across the channel reveals heights of 46+/−2 nm for the gold electrodes and 30+/−2 nm for the $Ta_2O_5$ ridge match the adjusted thicknesses. A profile perpendicular to the grating grooves on top and next to the ridge confirms the adjusted height of 30+/−2 nm.

Optimization of Dimensions

In order to achieve optimized device performance, it is important to carefully choose the dimension of the structural constituents. The device performance very delicately relies on well-balanced layer thicknesses. For the application of a LEFET acting as source of a laser device, both the transistor performance and the light gain should be optimized simultaneously.

Simulations were performed with the software Lumerical MODE Solutions (Lumerical Solutions Inc.). It is able to calculate the developing confined electromagnetic modes and their absorption losses within a defined environment. The materials are characterized by wavelength-dependent complex refractive indices. The imaginary parts of the materials are either negligible (glass, PMMA, $Ta_2O_5$) or complicated to determine in the presence of charges (F8BT). The anisotropy of the optical constants, in particular for F8BT is a factor that cannot be included in the simulation. As most of the polymer chains are aligned horizontally, the in-plane refractive index, which is higher than the out-of-plane value, is relevant, and thus used. The complex parameters of the metals are incorporated into the material database of the software, guaranteeing realistic behavior including losses.

The dimensions are chosen to match the fabricated structure presented in the previous section, with exception of the thickness of the waveguide structure. In order to make allowance for the corrugated surface of the DFB resonator, the thickness of the homogenous part and the ridge are chosen to be an average of the two different thickness values along the z-direction. Because the parts next to the ridge exhibit a modulation between the bare glass substrate and 30 nm thick waveguide material, and the ridge itself comprises alternating 30 nm and 60 nm thick waveguide material, the thicknesses for e.g. a gating duty cycle of 1:1 are chosen 15 nm and 45 nm, respectively.

FIG. 2(B) presents the simulation of the ground-mode ($TE_0$) within the proposed structure with $Ta_2O_5$. The result is an exponentially decreasing confined mode centered at the ridge/F8BT interface in the middle of the channel. Possible higher-order TE modes exhibit additional nodes in x-direction. The mode simulation in FIG. 2(C) shows the result for the standard device architecture on bare glass substrate without any additional waveguide structures. Although the mode exhibits a similar shape as in the case of an additional waveguide rib, there are fundamental differences. The weak mode confinement in x-direction is only due to the source and drain electrodes on either side of the channel. Even more dramatic is the reduction of mode confinement in y-direction. As the refractive index contrast between the cladding materials and the F8BT core is not sufficient the mode considerably leaks into glass substrate, gate dielectric, and metal gate. $Ta_2O_5$, however, exhibits a larger refractive index than the cladding layers of glass and PMMA. As a consequence, the hybrid waveguide core of waveguide oxide and F8BT increases the mode confinement in y-direction substantially. Additionally, the waveguide ridge leads to a strong confinement within the channel in x-direction. This two-dimensional mode confinement yields concentrated electric fields in the vicinity of the waveguide ridge and active region, as well as guided propagation of the emitted light. The mode overlap with absorbing metal electrodes, which is a severe drawback in electrically driven light-emitting devices, is minimized.

In order to quantify the improved confinement due to the additional waveguide rib, the electric field intensity is calculated by Lumerical MODE Solutions. A figure of merit for the confinement is the integrated electric field intensity within the $Ta_2O_5$ as well as within the part of the F8BT directly above the ridge. For comparison, the same region was also investigated for the standard structure. It is found that the mode is distributed between the F8BT gain material and the waveguide material. About 32% of the mode intensity is located within the F8BT part above the waveguide ridge. It is obvious that due to the strong confinement in x-direction the mode proportion within and above the ridge is practically identical with the complete proportion in the individual material. The situation is different in the standard structure without waveguide rib. Within the same area in the middle of the channel, the mode percentage is more than halved, and less than 15% of the mode is located there.

The fact that in the standard structure the modes reach relatively far into the cladding layers, and therefore into the electrodes, has drastic consequences on the overall absorption loss of the light propagating in z-direction. Whereas the ground-mode within the waveguide rib structure with $Ta_2O_5$ exhibits a loss of 19.2 dB/cm, the limited confinement leads to a dramatically increased loss of 117.2 dB/cm within the standard structure. At this point, it is to note that the structure call be further optimized in terms of loss reduction. The possibility of varying the PMMA thickness and/or the gate material is discussed in detail in the following section.

The enhanced light confinement of the rib waveguide structures reflects in higher effective refractive indices $n_{eff}$ of the corresponding modes. The calculation of $n_{eff}$ in a complex structure such as an LEFET is complicated, and is therefore performed by Lumerical MODE Solutions. The findings are in excellent agreement with the experimental results. According to the simulation, the standard LEFET structure with 70 nm thick F8BT exhibits an effective refractive index of the ground-mode of $n_{eff}=1.55$. The $Ta_2O_2$-based rib waveguide structure yields a significantly larger value of 1.65-1.67 within the wavelength range of interest, dependent on the grating duty-cycle. It is found that the dimensions of the substrate, the dielectric and the three electrodes do not affect $n_{eff}$ if substrate and PMMA are sufficiently thick (>250 nm). The calculated effective refractive mode index $n_{eff}$ allows for determining the ideal DFB grating period A for a given emission wavelength λ. The estimation follows the Bragg condition for second-order emission (m=2), $$m \cdot \lambda = 2 \cdot n_{eff} \cdot \Lambda.$$

Of great importance for efficient light feedback is the overlap between the propagating mode and the gain region, where the excited states are created, and hence the light is emitted. This factor limits the useful thickness of the confining waveguide rib. Due to the lower refractive index of F8BT with respect to the one of $Ta_2O_5$, the mode tends to be pulled too far into the waveguide rib for increasing thickness. In the TG/BC ambipolar LEFET structure, the gain region is localized at the semiconductor (F8BT)/dielectric (PMMA) interface.

By systematically varying the thicknesses of the F8BT and the waveguide material, the structure can be optimized to match the desired criteria. In addition to the integrated electric field intensity within a certain region, the normalized mode intensity at the F8BT/PMMA interface has to be considered as a second important quantity. Furthermore, one has to consider that the F8BT thickness variation range is restricted by the waveguiding and transistor performance. It cannot be made too thin for sufficient waveguiding in the F8BT. Beyond a certain thickness, on the other hand, transport problems occur due to enhanced contact resistance, and thus the light emission is reduced considerably. Additionally, the incoupling of the light emitted at the F8BT/PMMA interface into the light mode centered close to the F8BT/$Ta_2O_5$ interface is limited if the distance between these two interfaces becomes too large.

The simulation (FIG. 4A) predicts an approximately linearly increasing mode proportion within the F8BT for increasing thickness of the F8BT layer with respect to the one of $Ta_2O_5$. The distribution of this proportion within the F8BT, however, is different. If one considers the corresponding values of the mode intensity within the gain region at the F8BT/PMMA interface, it is observed that increasing the F8BT thickness leads to a substantial reduction. Keeping these opposite tendencies in mind a $Ta_2O_5$ thickness of 45 nm as well as an F8BT thickness of about 70 nm occurs to be a good trade-off, resulting in a thickness modulation of the DFB grating between 30 nm and 60 nm on top of the waveguide ridge.

Analysis of Electrode Absorption Losses

One important aspect of designing a suitable architecture for electrically pumped lasing is the minimization of additional absorption losses caused by the metal contacts. In case of an LEFET there are the source and drain contacts as well as the top gate electrode. Whereas in the F8BT-case the source and drain electrodes have to be made of gold for efficient electron and hole injection, the gate electrode material can be chosen more flexibly. In practice, air-stable metals like gold or silver are preferred. These metals differ in their absorption and internal reflection properties.

The comparably large channel length of 10 µm between source and drain contacts as well as the mode confinement induced by the additional 3 µm wide waveguide ridge prevents the light almost completely from being absorbed at source and drain. The gate electrode, however, is commonly just a few hundred nanometers isolated from the active layer, and hence the confined light mode centre. This distance is determined by the thickness of the gate dielectric. Consequential, both the thickness of the dielectric and the material of the gate electrode should be optimized to provide decent light propagation without severe absorption loss. This optimization is performed with the help of Lunlerical MODE Solutions. As previously, all materials are chosen to be lossless apart from the metals. This is a decent assumption for $Ta_2O_5$ and PMMA, as well as the glass substrate (however, neither the inevitable absorption losses nor the induced gain within the FXBT were considered).

FIG. 4(B) illustrates the calculated propagation loss of the ground-mode, visualized in the inset, dependent on the thickness of the PMMA gate dielectric. The graphs show an exponential decrease of the loss with increasing PMMA thickness. The fact that an exponential decay fits the data reflects the character of the confined mode with exponentially decreasing tales leaking into the cladding layers. Hence, when the dielectric thickness is increased linearly, the mode overlap with the gate is reduced exponentially. Varying the thickness of the gate metal itself hardly affects the propagation loss as the absorption occurs within the range of the characteristic penetration depth, which is typically just a few nanometers.

It is found that the mode propagation loss can be reduced substantially using a more suitable gate metal than gold, which is commonly used. Silver is such a material and the equivalent structure exhibits less absorption losses at the wavelength range of interest (here: 562 nm) than the one with gold gate. In the following the database values of Lumerical MODE Solutions are used, which rely on experimental data. Whereas silver has a slightly higher extinction coefficient of $k_{Ag}$=3.70 compared to gold with $k_{Au}$=2.62, the difference of the real part of the refractive index is more drastic. The silver value $n_{Ag}$,=0.06 in comparison to $n_{Au}$=0.37 leads to a mode leaking much less into the gate. This effect outperforms the fact that slightly more of this mode tale light gets absorbed.

However, the pure optimization of the device structure in terms of minimal propagation loss is not particularly meaningful in practice. The simulation suggests making the PMMA as thick as possible to reduce the gate absorption loss. From a transistor performance point of view, PMMA exhibits the function of the gate dielectric, and is responsible for the charge accumulating capacitance C. Following the logarithmic decibel definition for the loss α in dB $cm^{-1}$, the light output $P_1$ for a given input $P_0$ results in $$P_1 = P_0 \cdot 10^{\frac{\alpha}{10}}.$$

In an ambipolar field-effect transistor, the current $I_d$ flowing between source and drain electrode in is proportional to the gate capacitance C, which is inversely proportional to the dielectric thickness t, $$I_d \propto C \propto t^{-1}.$$

Therefore, the drain current drops as the PMMA thickness t is enlarged. In order to determine the optimal PMMA thickness, which leads to a compromise between absorption loss and transistor current, a figure of merit (FOW proportional to the light output PI is defined. As the light input $P_0$ is proportional to the current $I_d$, equations (2) and (3) can be merged to:

$$FOM \propto \frac{1}{t} \cdot 10^{\frac{\alpha}{10}}.$$

This figure of merit is maximal in case of an optimal structure. FIG. 4(C) presents the trend of the normalized FOM for varied PMMA thickness t in case of gold and silver gate. Thin PMMA layers thinner than 340 nm or 260 nm for gold and silver, respectively, lead to a small FOM value less than 0.1. The optimum thickness t leading to maximized FOM is found to be around 540 nm for gold and 420 nm for silver gate. Therefore, a silver gate is preferable as the smaller thickness means a higher transistor current.

Transistor Characteristics and EL Spectra Under Electrical Excitation

Figure 5:
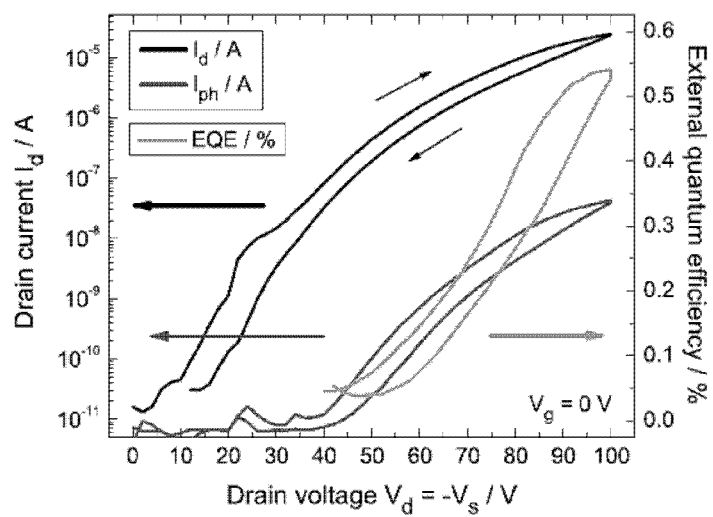
FIG. 5 shows the electrical characteristics of an F8BT/PMMA LFET with integrated DFB rib waveguide.

The electrical characteristics of a typical LEFET device with $Ta_2O_5$-based feedback structure and optimized dimensions were analyzed. Ambipolar behavior with high currents in the light-emission regime can be observed. A hole mobility of μh=1.4×$10^{-3}$ $cm^2V^{-1}s^{-1}$ and a hole threshold voltage of =−25 V are extracted. The respective electron transport parameters are μe=7×$10^{-4}$ $cm^2V^-s^{-1}$ and $V_{th,e}$=35 V. The graphs in FIG. 5 show the device characteristics during an ambipolar IV-sweep. Whilst the gate electrode is kept constant at 0 V and the voltage difference $V_d$ between source and drain is enlarged, the drain current $I_d$ and the photocurrent of a a diode on top of the device increase $I_{ph}$ are recorded.

It is important for potential application as an electrically pumped laser device to quantify the strength of the optical excitation under transistor operation. From the maximum achievable ambipolar transistor current Id, extracted from FIG. 5, one is able to estimate the important singlet exciton density within the recombination zone:

$$n_{ex} = \frac{I_d}{ewW} \cdot \chi \cdot \tau_{ex} \cdot \eta_{PL},$$

with e being the elementary charge and W the given transistor channel width. If one assumes a singlet exciton ratio of χ=0.25, and uses typical values for the exciton lifetime and the F8BT's PL efficiency of $\tau_{ex}$=1 ns and $\eta_{PL}$=0.55, respectively as well as the measured width of the recombination zone of w=2 µm, a result of about $n_{ex}$=2-3×$10^8$ $cm^{-2}$ is obtained.

The exciton density can be enhanced, for example, by using organic semiconductors with higher ambipolar field-effect mobility or by using gate dielectrics with higher k supporting higher currents.

Figure 6:
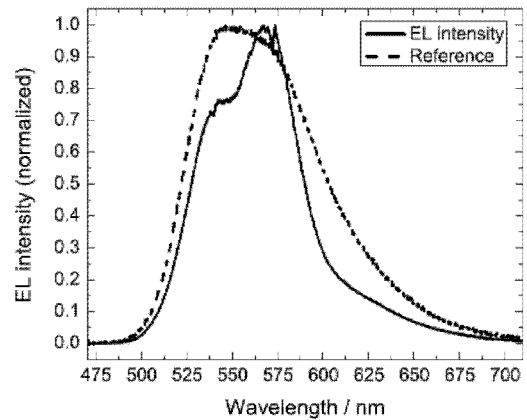
FIG. 6 shows the EL spectrum of a LFET with integrated DFB structure (AIB) and a simulation of the corresponding modes (C)
Figure 6:
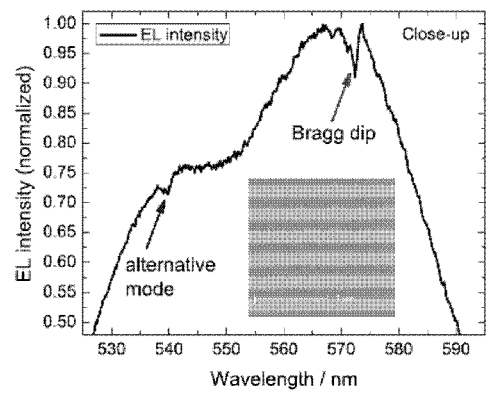
Figure 6:
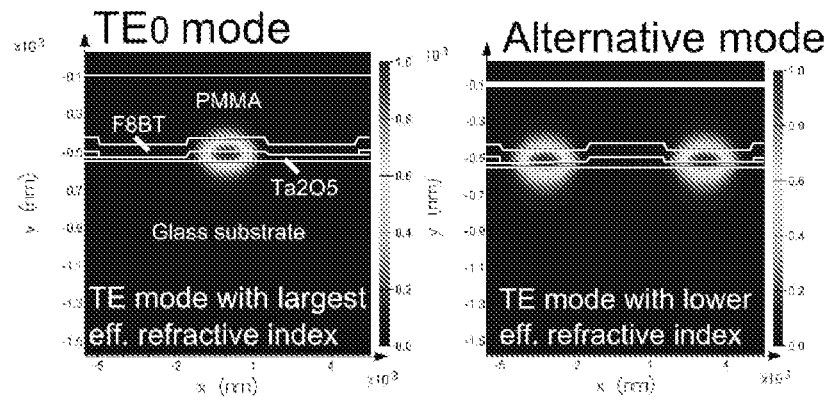
Figure 7:
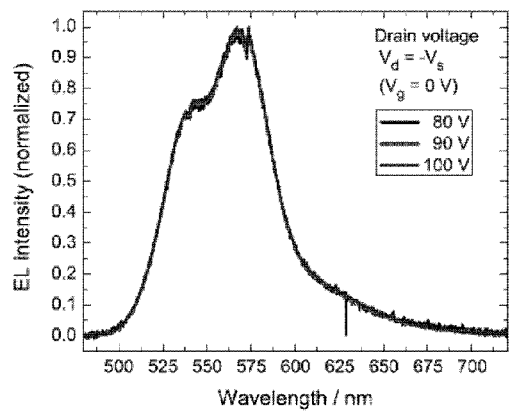
FIG. 7 shows EL specta of the device in FIG. 6 as a function of drive voltage (A) and of position of the recombination zone in the channel (A), and a image of the light emitted from the edge of the substrate (C)
Figure 7:
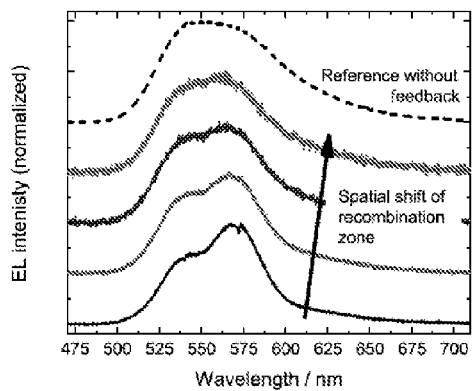
Figure 7:
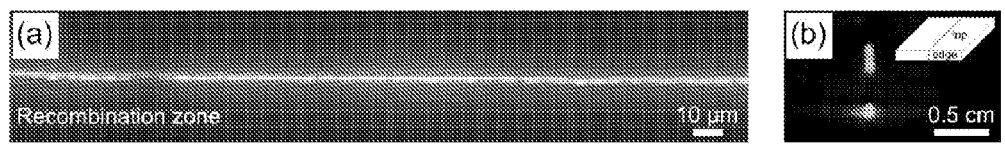

In order to discuss the individual features of typical electroluminescence (EL) spectra of the devices with integrated waveguide rib DFB structure, the grating duty cycle is chosen to be 1.5:1 with a larger $Ta_2O_5$ fraction. The grating period of this particular device is measured to be about 345 nm. FIG. 6 shows the EL spectrum of the device during the ambipolar IV-sweep of FIG. 5. It is found that the feedback mechanism strongly modifies the spectrum in comparison to a reference LEFET device on bare glass substrate. The spectrum is narrower and exhibits a hump centered at around 565 nm indicating the resonant light mode. The resulting EL spectra for voltages $V_d=-V_s=80$ V, 90 V and 100 V are shown in FIG. 7(A). Despite the fact that the absolute light intensities increase due to the increasing currents, it is observed that the spectral shape is not affected by the stronger excitation during this electrical pumping sweep. Minor deviations are likely to be due to measurement tolerances and noise.

However, if for a large voltage $V_d$ between source and drain electrode the gate bias $V_g$ is swept during a transfer scan, it is found that this is accompanied by a change of the shape of the EL spectrum. FIG. 7B illustrates this observation. The spectrum's grating-induced hump around 565 nm steadily vanishes when the gate voltage is modified, and the overall shape becomes more similar to the reference spectrum without feedback structure. This steady transition is attributed to a movement of the recombination zone away from the ridge whose overlying DFB grating induces the resonance at a wavelength within this hump. Consequential, the coupling of the emitted light into the rib waveguide feedback structure becomes weaker and the hump becomes less pronounced.

The close-up view of the EL spectrum in FIG. 6B allows for analyzing the individual spectral features. The main feature, induced by the second-order DFB structure, is the characteristic Bragg dip within the intensity hump at around 573 nm. Following the Bragg condition, expressed by equation above, it indicates the arising photonic stopband, which inhibits propagation of waveguided photons within the feedback structure. Its depth is a measure of the excellent grating quality. The value of the via Bragg condition experimentally determined effective refractive mode index $n_{eff}$ matches the theoretically determined value for the $TE_0$ ground-mode of 1.67, illustrated in FIG. 6C, taking into account possible minor deviations in the simulation regarding material thicknesses and refractive indices.

In addition to the main resonance, a smaller second dip occurs in the EL spectrum at about 540 nm. This feature is believed to indicate the resonant wavelength for photons that are waveguided in a mode with smaller effective refractive index $n_{eff}$. This conclusion is fueled by the Bragg condition. It is found that $n_{eff}$ only changes slightly with wavelength over this wavelength range. Hence, the Bragg condition leads to a smaller resonant wavelength $\lambda$ for a constant grating period $\Lambda$. In the given structure, the observable alternative mode is attributed to a TE mode that contains its major part of the light in pure grating regions left and right of the central ridge. As such a mode contains less $Ta_2O_5$ parts, its effective refractive index is considerably lower. A simulated $n_{eff}$ value of 1.58 fits the experimental findings and supports the interpretation.

The important function of the ridge as part of the DFB feedback structure can be demonstrated by varying its thickness. If the height of the ridge comprising $Ta_2O_5$ with larger refractive index is reduced, the effective refractive index $n_{eff}$ of the resonant mode is lowered. According to the Bragg condition, this is accompanied by a smaller resonant wavelength $\lambda$. When a just 20 nm $Ta_2O_5$ ridge height is used instead of the standard 30 nm a consequential blue-shift of the Bragg resonance is observed with a strong dip at about 566 nm. A simulated effective refractive index of the $TE_0$ mode of 1.64 instead of 1.67 with thicker ridge agrees with the experiment.

Analogously fabricated LEFET devices incorporating a $Ta_2O_5$-based feedback structure with standard duty cycle 1:1 and a measured grating period of 339 nm, used in the following sections, show accordingly modified spectral emission behavior. A duty cycle of 1:1 means a smaller amount of $Ta_2O_5$ with large refractive index, and hence a reduced $n_{eff}$. The Bragg dip indicates a resonance around 560 nm. With the estimated value of $n_{eff}=1.65-1.66$, the experimentally observed resonant wavelength is in good agreement with the theoretical value determined by the mode simulations. It is to notice that in this feedback structure configuration, the alternative resonance dip is expected to be shifted to even smaller wavelengths away from the emission peak, and is therefore no longer apparent in the measurements. Moreover, the EL spectrum and in particular the induced resonance is in excellent agreement with the PL spectrum below the lasing threshold of the same device under optical excitation.

FIG. 7C shows an optical image of the recombination zone viewed from the top when placed on top of the waveguide (a) and of the light emitted from the edge of the substrate (b). The shape of the recombination zone does not appear to differ substantially from the reference device whilst being scanned throughout the channel. Nevertheless, a strong in-plane waveguiding effect can be recorded. The camera image in (b) points out that, instead of being homogeneously spread, the emitted light is guided alongside the rib towards the edge. The silver mirror on top strengthens the guiding additionally. The light is coupled out of the edge, manifesting in a pronounced green spot. The second-order grating leads to out-of-plane outcoupling, yielding a big part of light coupled out through the surface of the device. This image proves very clearly that we have been able to couple light from the LFET effectively into the waveguide.

PL and Lasing Spectra Under Optical Excitation

In order to investigate their potential as electrically driven organic semiconductor laser, the lasing properties of the fabricated devices are examined via optical pumping. Particularly, the lasing threshold values are of great importance and their dependence on the transistor electrode structure.

The laser system exciting the structures comprises a TOPAS (Light Conversion Ltd.) which is tuned to emit pulses with typical wavelength $\lambda=488$ nm (pulse width about 100 fs, repetition rate 1 kHz) in order to match the F8BT absorption. The aligned beam is focused onto the sample. Because of the absorbing metal gate, the device has to be pumped through the glass substrate (1737 Low Alkali Glass, 0.7 mm thick, Pr\"{a}zisions Glas \& Optik GmbH). For practical reasons, the emission from the second-order feedback structure is detected through the substrate by an optical multimode fiber, which detects the light emission perpendicular to the sample surface, and passes the signal on to the spectrometer (Ocean Optics USB2000).

The lasing performance of the devices is quantified by determining the threshold as a characteristic figure of merit. For this purpose, the emission intensity $P_{out}$ (output) at the lasing wavelength is plotted as a function of the pump energy $P_{pump}$ (input). In the given device architecture and measurement method, the input is given as a energy density, normalized by the beam size and making allowance for a finite transmission of the glass substrate at the pump wavelength (92%). An abrupt change in the slope of the output versus input curve, visualized by the intersection of the linear fit below and above the threshold, indicates the lasing threshold value. Another meaningful value is the slope efficiency $\eta_{slope}$, which is defined as the gradient of the linear fit of the output power above the threshold $P_{th}$, $$P_{out} = \eta_{slope} \cdot (P_{pump} - P_{th}) \text{ with } \eta_{slope} \propto \beta^{-1}.$$

Important for the interpretation of the slope efficiency $\eta_{slope}$ is the finding that it is inversely proportional to the resonator losses $\beta$.

Figure 8:
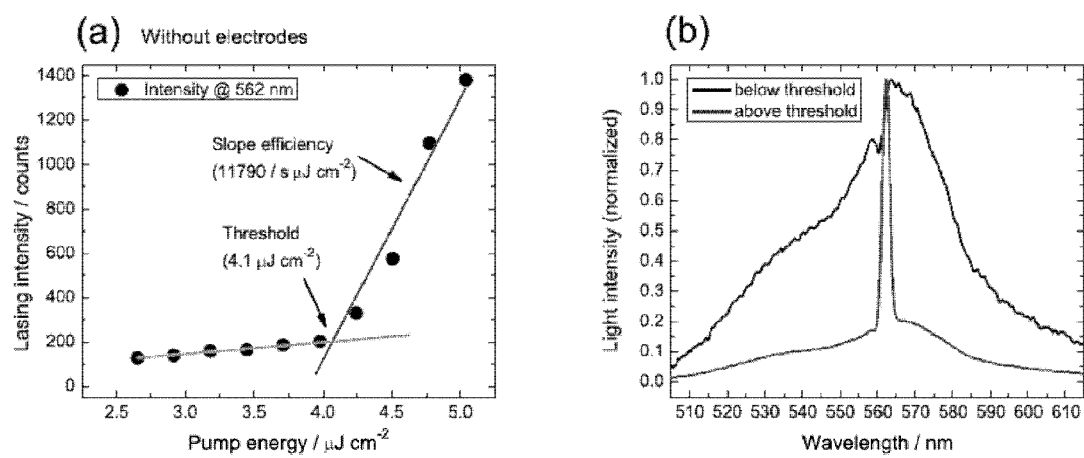
FIG. 8 shows optically pumped lasing characteristics of a rib waveguide structure with FBBT, and 350 nm PMMA, but without any electrodes.

The ideal lasing characteristics of the feedback architecture can be obtained if one fabricates the structure above, but without any potential light-absorbing electrodes (source, drain, gate). FIG. 8 shows the resulting emission spectra of the $Ta_2O_5$-based rib waveguide DFB structure with duty cycle 1:1 of the previous section, with deposited PMMA cover layer (325 nm) but without any electrodes for increasing pump energy.

Two qualitatively different regimes below and above the lasing thresholds are illustrated. In contrast to the results of the electrical pumping, one is able to induce lasing within the structure, which manifests in a PL spectrum that collapses into a sharp emission peak with steeply growing intensity above the lasing threshold. This peak exhibits a FWHM of less than 2.5 nm, limited by the spectral resolution of the spectrometer. The peak arises at a wavelength that is determined by both the feedback structure, in particular the Bragg wavelength of the grating, and the gain region of the F8BT as the active material. The region of maximal stimulated emission is found to be between 560-570 nm. In the given architecture, taking into account experimental and fabrication tolerances, lasing typically occurs at 560-562 nm. Following the Bragg condition an experimentally determined effective refractive index of $n_{eff}=1.65$ is in excellent agreement with the mode simulations for this particular structure. Therefore, it is assumed that the ridge-induced $TE_0$ ground-mode with largest $n_{eff}$ is the actual lasing mode, meaning that it has the largest effective gain as best compromise between gain region overlap and propagation loss.

Even below the lasing threshold, the integrated feedback structure exhibits a drastic impact on the surface emission spectrum of the device. The broad emission spectrum of a standard F8BT-based LEFET is narrowed due to the filtering feedback structure. Clearly visible is the pronounced Bragg dip, representing the induced stopband that inhibits photon propagation.

Above the threshold, the lasing peak occurs at the long-wavelength edge of the Bragg dip, which is a sign of a feedback mechanism dominated by index coupling. The observation that gain coupling in the devices plays a minor role is not obvious. As a consequence of the spin-coating process, which leads to a slight smearing out of the underlying structure, a small modulation of the F8BT gain material thickness on top of the relatively shallow grating can favour gain coupling. This would lead to a more pronounced complex coupling with laser emission inside the Bragg dip. While periodic gain modulation may be present in the fabricated device, lifting the degeneracy of the modes at the edges of the stopband, the emission spectra, however, strongly point to a complex-coupled system dominated by index modulation. By optimizing the film thickness profiles of the F8BT film we can modify the gain and index modulation.

A corresponding plot of the light intensity at the lasing wavelength depending on the pump energy allows for extracting a very low threshold energy density of $4.1 \pm 0.3$ µJ cm$^{-2}$. This value is about a factor six lower than the reported threshold of a one-dimensional DFB structure etched into glass with F8BT as gain medium (Xia, APL 87, 031104 (2005)). Furthermore, a slope efficiency of $11790 \pm 1000$ counts/s µJ cm$^{-2}$, normalized by the integration time, can be extrapolated.

Figure 9:
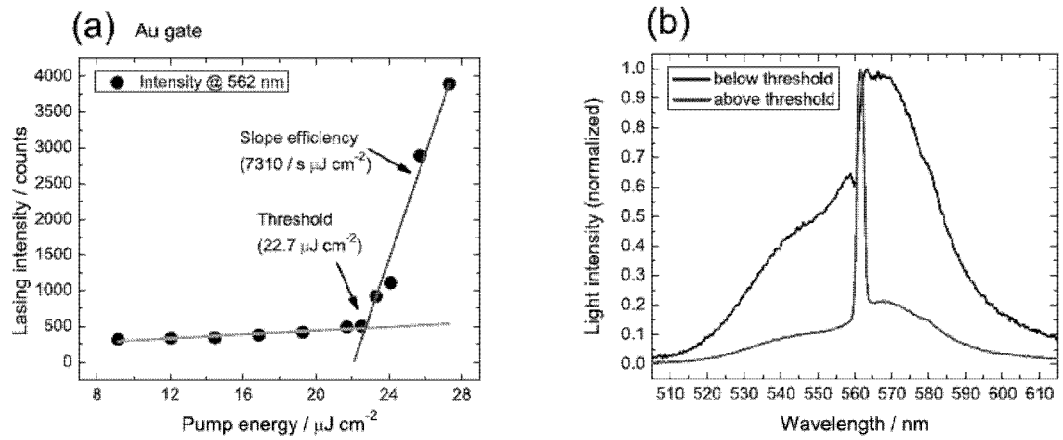
FIG. 9 shows optically pumped lasing Characteristics of a rib waveguide structure with F8BT, and 325 nm PMMA, with gold gate electrode, but no source-drain electrodes.
Figure 10:
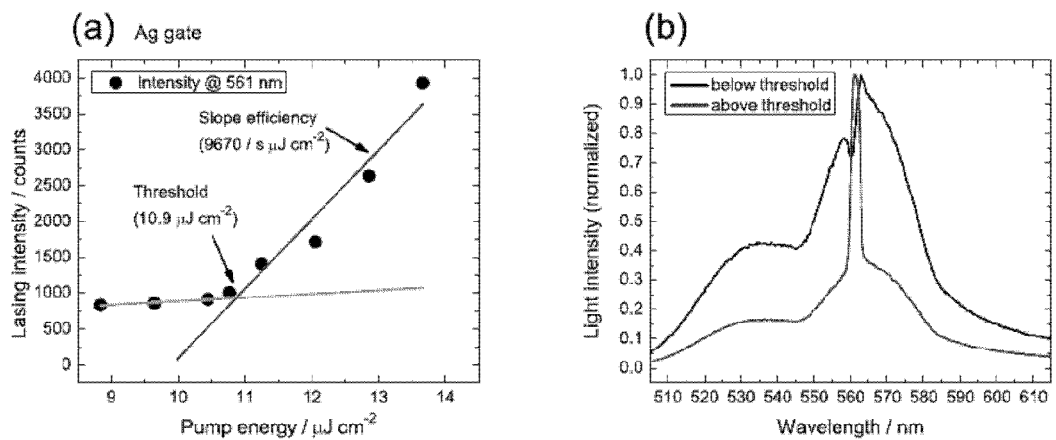
FIG. 10 shows optically pumped lasing characteristics of a rib waveguide structure with F8BT, and 325 nm PMMA, with silver gate electrode, but no source-drain electrodes.

As predicted by the mode simulations, adding a metal gate electrode on top of the 325 nm thick PMMA dielectric of the device causes severe absorption, and thus considerably higher thresholds (FIGS. 9 and 10). Apart from the influence of the gate electrode on the threshold value, it is found that the qualitative characteristics of the spectra below and above the threshold remain unaffected. Independent of the gate material and the PMMA isolation layer thickness, Bragg dip and lasing occur at the same wavelengths, considering experimental tolerances. When one adds a gate electrode comprising gold on top of the device, a more than five times higher threshold energy of $22.7 \pm 0.3$ µJ cm$^{-2}$ is found. The higher resonator loss $\beta$ also manifests itself in a drastically reduced slope efficiency, as predicted. Changing the gate electrode material to silver for the same PMMA thickness is expected to reduce these additional absorption losses. Without any further modifications to the device architecture, a measured threshold value of $10.9 \pm 0.3$ µJ cm$^{-2}$ is more than halved in comparison to gold gate. Consequential, the slope efficiency is also compared to the gold gate value. Yet, the threshold characteristics are still considerably worse than without gate electrode.

Figure 4:
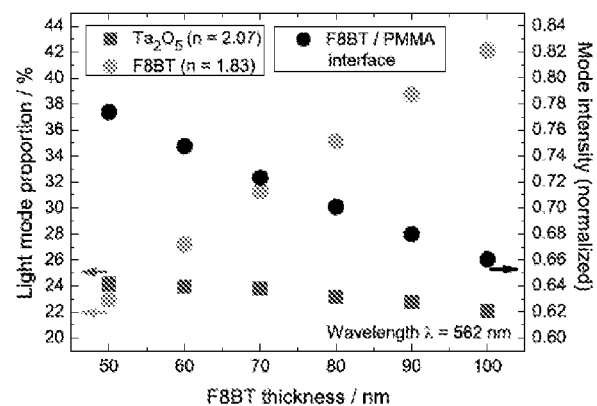
FIG. 4 shows simulations of the relative mode intensities ill the different portions of the devices (A), the predicted optical losses due to absorption at the gate electrode (B) and the figure of merit for optimizing the thickness of the gate dielectric (C)
Figure 4:
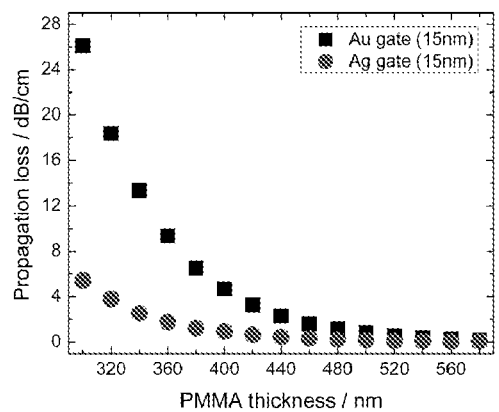
Figure 4:
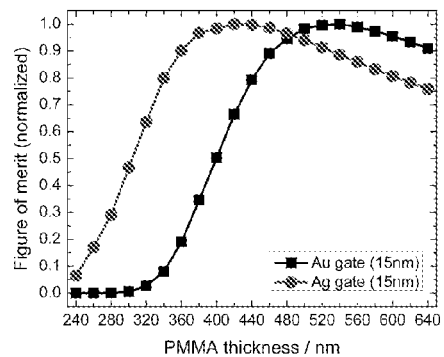
Figure 11:
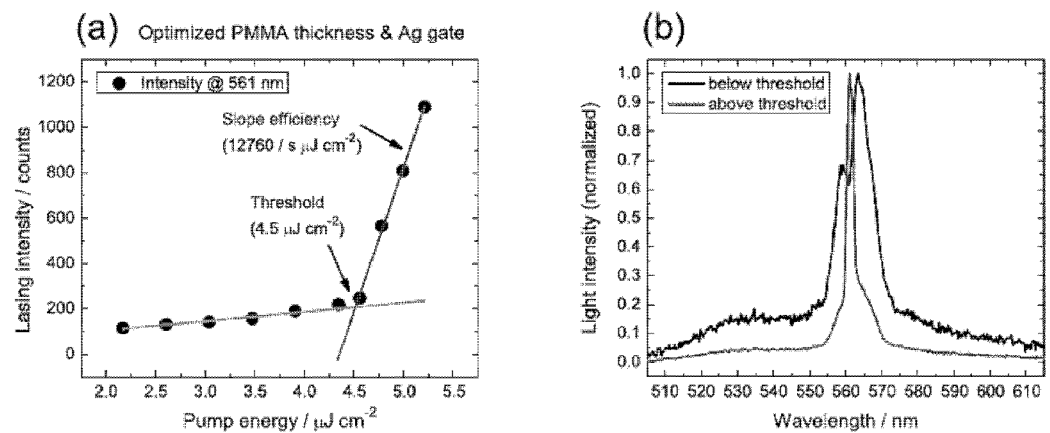
FIG. 11 shows optically pumped lasing characteristics of a rib waveguide structure with F8BT, and 430 nm PMMA, with silver gate electrode, and no source-drain electrodes.

Following the theoretical optimization process according to the mode simulations, an increased PMMA thickness leads to better isolation of the metal gate, and hence less absorption losses. If one also considers the influence on the transistor current, and therefore the overall light emission intensity, a PMMA thickness of about 420-430 nm for silver gate is optimal (FIG. 4). Consistent with the simulations, a device with silver gate but with an optimized PMMA thickness of 430 nm exhibits a threshold energy of $4.5 \pm 0.3$ µJ cm$^{-2}$ (FIG. 11) which is just marginally higher than the value without gate, and thus considerably lower than with 325 nm thick PMMA. The slope efficiency of the device with optimized PMMA thickness and silver gate is also comparable or slightly greater than the one without gate.

The threshold value is expected to decrease exponentially for increasing PMMA thickness approaching the value without gate electrode. Therefore, the residual difference in the threshold value is due to the finite PMMA thickness, which is chosen to also take into account the influence on the transistor current. However, the exponential behavior explains the strong decrease of the threshold value of more than a factor two for a PMMA thickness increase from 325 nm to 430 nm.

These experimental results devices with different gate material and/or dielectric thickness are in excellent agreement with the predictions of the theoretical optimization performed via mode simulations. This finding strongly supports the interpretation that the mode propagation loss due to the metal gate absorption is the responsible mechanism determining the lasing threshold variations.

Figure 12:
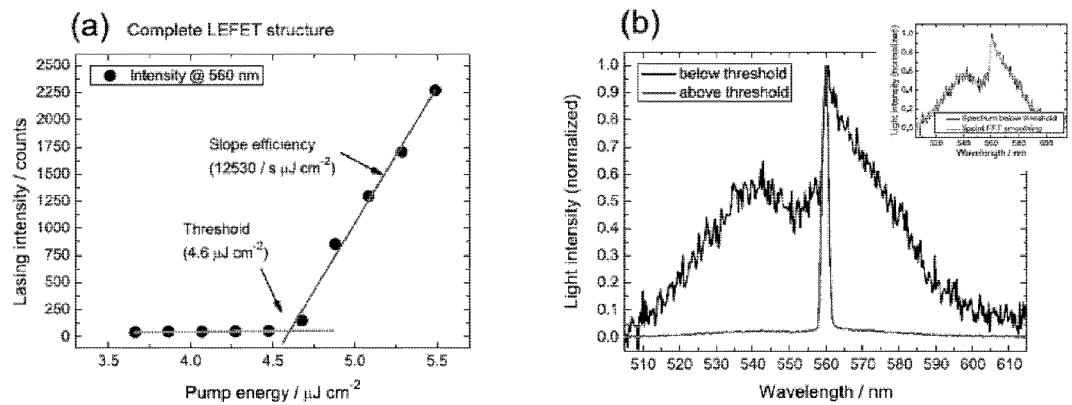
FIG. 12 shows optically pumped lasing characteristics of the full structure with a rib waveguide structure with F8BT, 430 urn PMMA, silver gate electrode, and gold source-drain electrodes.

If the T-shaped source/drain electrode pattern is aligned next to the waveguide ridge on top of the grating, the golden source/drain pattern with typically 45 nm thickness acts as a shadow mask for the incident pump beam, and the F8BT above the electrodes is not excited. FIG. 12 shows the emission characteristics under optical excitation for such a complete LEFET structure including the source and drain electrodes in addition to the silver gate structure with 430 nm PMMA dielectric. As intended by the sophisticated feedback structure design with additional waveguide ridge, the lasing threshold energy is not affected by the additional electrodes. A threshold value of $4.6 \pm 0.3$ µJ cm$^{-2}$ in combination with a slope efficiency of $12530 \pm 1000$ counts/s µJ cm$^{-2}$ confirms the values of the analogous structure without source/drain pattern, demonstrating the excellent mode confinement of the rib waveguide structure in the vicinity of the ridge far away from the electrodes.

This demonstrates very clearly that absorption at all three electrodes in the LEFET architecture with integrated DFB waveguide is minimized, and thus optimized for electrically pumped lasing.

Figure 13:
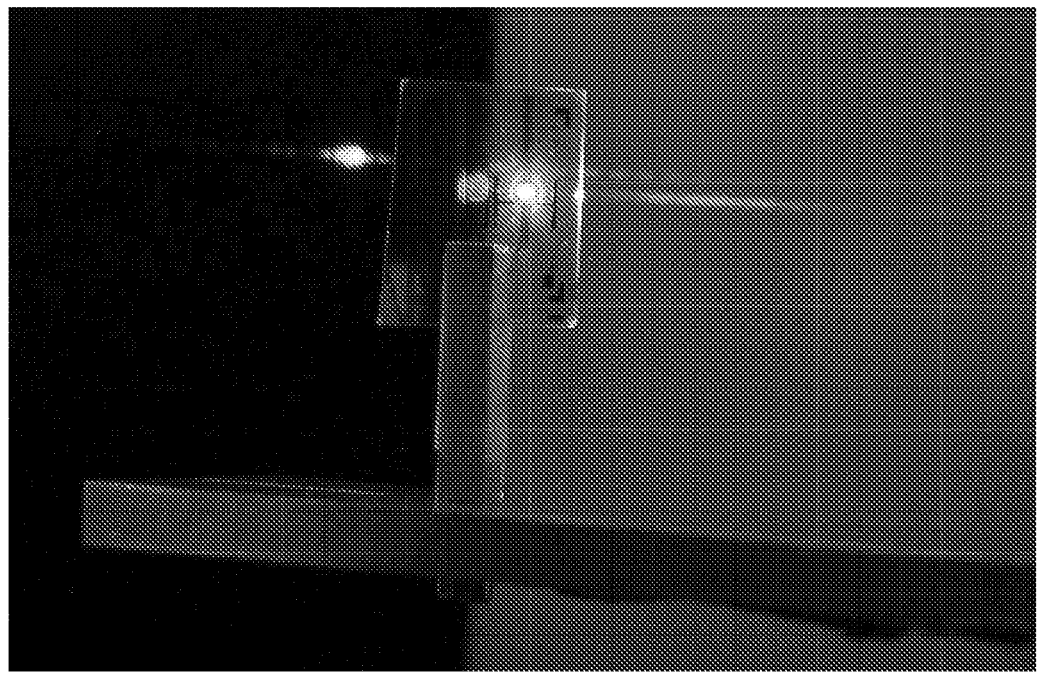
FIG. 13 presents a digital camera image of the far-field mode pattern of the laser emission, identifying a transverse mode profile similar to a typical $TE_0$ mode.

FIG. 13 presents a digital camera image of the far-field mode pattern of the laser emission, identifying a transverse mode profile similar to a typical $TE_0$ mode. The observed sharp emission line, which is polarized parallel to the one-dimensional grating grooves, appears thicker in the middle revealing the additional mode confinement due to the underlying waveguide ridge.

One characteristic of the proposed rib waveguide DFB structure is the possibility to support multiple resonant modes at the same time. This phenomenon is suppressed in the structures with main resonance around 560 nm as the relevant alternative modes are shifted to resonance wavelengths below the gain spectrum of F8BT. For slightly larger grating periods, however, a suitable alternative mode resonance can overlap with the gain spectrum, and is therefore able to support lasing, too. Whereas the ridge-induced ground-mode has minimal propagation loss, an alternative mode with bigger parts next to the ridge can have a more favorable overlap with the F8BT gain region at the PMMA interface. As a consequence, the emitted photons are partially coupled into the alternative mode, and lasing can occur at two wavelengths simultaneously.

The determined typical lasing threshold energy densities of the order of $E_{th} \sim 1$ µJ cm$^{-2}$ allow for quantifying the discrepancy between the achievable excitation density in the given LEFET structure and the one expected to be required for electrically pumped lasing. According to the simple relation $$E_{th} = n_{ex} \cdot \frac{hc}{\lambda} \quad (7)$$

with the Planck constant h, the speed of light c, and the wavelength of λ=450 nm corresponding to the absorption maximum of F8BT. A result for the singlet exciton density of about $n_{ex}=2\times10^{12}$ cm$^{-2}$ attests that the performance of a typical device with a value of about 2-3×10$^8$ cm$^{-2}$, derived in equation (5), is about four orders of magnitude below this. However, it is observed that it remains unclear at this stage how this value is further affected by additional charge-induced loss mechanisms such as polaron absorption and exciton-polaron quenching.

The device architecture presented in the present application allows for efficient in-coupling of the light emitted from an ambipolar light-emitting field-effect transistor into a high-n rib waveguide DFB feedback structure. The dimensions of the device were optimized to ensure good transistor characteristics and efficient feedback performance simultaneously.

The position of the recombination zone, which can be moved within the channel by the applied voltages, has an impact on the EL spectrum of the surface emission that is induced by the second-order DFB grating. The incoupling into the resonant waveguide is optimized when the recombination zone is positioned above the ridge of the feedback structure, where the TE ground-mode is confined. The resonance wavelength, indicated by a characteristic Bragg dip, can be shifted by varying the grating period and duty cycle, as well as the ridge height.

The spectral position of the optically pumped laser peak is consistent with the EL measurements. Being an important issue in electrically pumped devices, the influence of adding transistor electrodes was investigated in detail. As predicted by mode simulations, particularly the gate electrode absorption of the propagating light is a limiting factor. It was confirmed that the lasing threshold is considerably larger without optimized gate material and dielectric thickness. Supported by the strong confinement of the rib waveguide structure, however, the combination of using silver instead of gold as the gate metal and enlarged PMMA thickness of 430 nm minimizes the disadvantageous influence on the threshold. The mode confinement within the rib waveguide structure also leads to the fact that the lasing threshold is unaffected by the integration of the source/drain electrode pattern. Low threshold values of typically around 4.5 µJ cm$^{-2}$ could be achieved in the complete LEFET structure, demonstrating the compatibility of the transistor with the feedback structure. In contrast to standard one-dimensional DFB gratings etched into glass, the structures including an additional material with high refractive index provides two-dimensional confinement that efficiently prevents severe absorption losses at the transistor electrodes.

To achieve electrically pumped lasing using the present structure it is important that organic semiconductors with high electron and hole mobilities are used. Preferably the ambipolar mobilities are higher than $10^{-3}$ cm$^2$/Vs, more preferrably $10^{-2}$ cm$^2$/Vs, and most preferably >$10^{-1}$ cm$^2$/Vs. At the same time, the material should have a high luminescence efficiency and optical gain. Such high values can be achieved in both semiconducting polymers (Yap, Nature Materials 7, 376 (2008)) as well as thin films or single crystals of small molecule organic semiconductors such as α,ω-bis(biphenylyl)terthiophene (BP3T) (Bisri et al. Proc. SPIE, Vol. 6999, 69990Z (2008)). Similarly, the gate dielectric needs to be selected to support both a high field effect mobility and a high effective dielectric constant in order to achieve high current density (Naber, Appl. Phys. Lett. 92, 023301 (2008). Techniques known in the prior art to improve the efficiency of the optical feedback structure and reduce further the optical losses in the structure can also be used.

Figure 14:
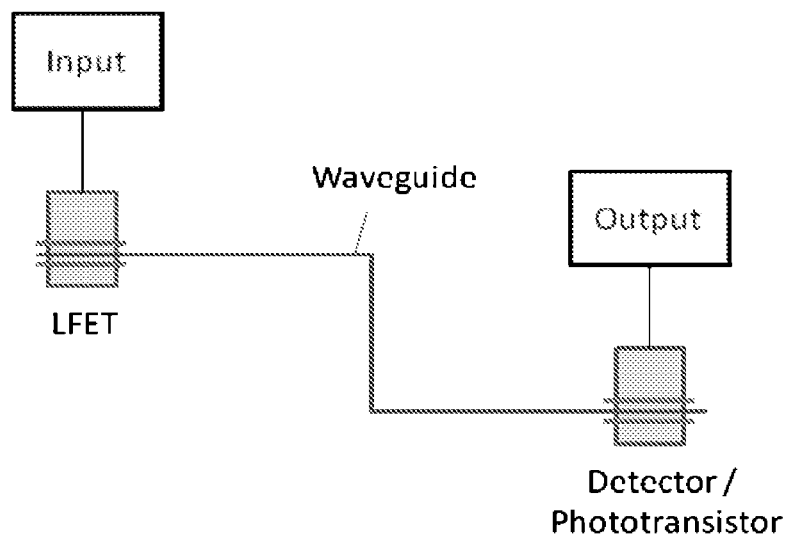
FIG. 14 shows an optoelectronic integrated circuit based on an LFET.

FIG. 14 shows an optoelectronic integrated circuit, which is another application of the present device. A signal input circuit provides an electrical input signal to the LFET, which is used to generate an optical signal coupled into a waveguide as discussed above. The optical signal is waveguided to a separate part of the circuit where the signal is detected and converted into an electrical signal for further information processing. The second portion may be either integrated onto the same substrate or on a separate substrate, and in this case the two substrates may be connected by an optical fibre. For such devices lasing is not necessarily required, but merely efficient signal transmission from the light-emitting FET to the detecting device at some distance from the LFET. In this case the requirements on the LFET are significantly less demanding and can be realized with a broad range of organic materials. The detecting function in the optoelectronic circuit of FIG. 14 may be realized by a photodiode detector or a phototransistor integrated with the waveguide. The latter has the advantage that the fabrication of the detector involves similar processing steps to that of the LFET allowing for more cost effective and simpler manufacturing of such devices.

The devices we described can advantageously be fabricated using solution-deposition techniques, in particular of semiconducting polymer(s). However the devices can not only be used with organic semiconductors, but also with inorganic semiconductor light-emitting materials, although in this case more complex fabrication and integration schemes may be employed.

No doubt many other effective alternatives will occur to the skilled person. It will be understood that the invention is not limited to the described embodiments and encompasses modifications apparent to those skilled in the art lying within the spirit and scope of the claims appended hereto.

In conclusion, the invention provides novel systems, devices, methods and arrangements related to optoelectronic devices. While detailed descriptions of one or more embodiments of the invention have been given above, a wide range of modifications and alterations may be made to the arrangement described hereinbefore without departing from the scope of the invention. Therefore, the above description should not be taken as limiting the scope of the invention, which is defined by the appended claims.

What is claimed is:

1. An optoelectronic device comprising a light-emitting field transistor (LFET) with an organic semiconductor active layer and a ridge or rib waveguide structure:
    wherein said ridge or rib waveguide structure forms a core of said waveguide;
    wherein said ridge or rib waveguide structure comprises a material which has a higher refractive index than said organic semiconductor;
    wherein said ridge or rib waveguide structure is confined entirely within the channel of the light-emitting field-effect transistor; and
    wherein said ridge or rib waveguide structure provides mode confinement in two dimensions within said LFET.

2. An optoelectronic device as claimed in claim 1 wherein the voltages applied to the LFET are selected such that the recombination zone of the LFET is located at least partially on top of the waveguide so as to allow efficient incoupling of light into the waveguide.

3. An optoelectronic device as claimed in claim 1 wherein said waveguide also comprises an optical feedback structure to modify the transmission of light travelling in the waveguide.

4. An optoelectronic device as claimed in claim 3 wherein such optical feedback structure is a distributed feedback structure.

5. An optoelectronic device as claimed in claim 3, wherein said optoelectronic device is a lasing device.

6. A lasing device as claimed in claim 5 wherein the pumping of the lasing device is achieved electrically through the current flowing between the source and drain electrodes of the LFET.

7. An optoelectronic device as in claim 1, comprising also a detector spaced apart from the LFET wherein said detector detects the light emitted from the LFET into the waveguide.

8. An optoelectronic device as claimed in claim 7 wherein said detector is an organic photodiode or a phototransistor.

9. An optoelectronic device as claimed in claim 1 wherein the thickness and dimensions of the individual layers of the LFET and of the waveguide are optimized such as to achieve one or more of the following: (i) low optical losses, (ii) high LFET current and (iii) incoupling of the light emitted from the LFET into the waveguide.

10. An optoelectronic device as claimed in claim 4, wherein the materials and dimensions of the waveguide structure are selected such that the Bragg condition for the DFB structure is fulfilled at a wavelength close to the maximum gain of the organic semiconductor.

11. An optoelectronic device as claimed in claim 1, wherein said waveguide is fabricated from a high-k inorganic oxide.

12. A light-emitting organic field transistor (LFET) as claimed in claim 1 wherein said waveguide is configured to provide an optical feedback mechanism.

13. A semiconductor laser comprising a light-emitting field effect transistor (LFET), the LFET having a channel comprising an organic semiconductor which, in operation, conducts charge carriers of two types of opposite polarity, and a ridge or rib waveguide structure;
    wherein said ridge or rib waveguide structure forms a core of said waveguide;
    wherein said ridge or rib waveguide structure comprises a material which has a higher refractive index than said organic semiconductor;
    wherein said ridge or rib waveguide structure is confined entirely within the channel of the light-emitting field-effect transistor;
    wherein said ridge or rib waveguide structure provides mode confinement in two dimensions within said LFET; and further comprising:
    a light reflector configured to provide an optical cavity for said laser.

14. A semiconductor laser as claimed in claim 13 wherein said optical feedback mechanism or light reflector comprises a distributed feedback structure with a period which substantially matches a second-order Bragg condition for a particular wavelength adjacent a gain maximum of the LFET or laser.

15. A semiconductor laser as claimed in claim 13 configured to support multiple resonant modes at different wavelengths simultaneously.

16. An optoelectronic device as claimed in claim 1 wherein said a light-emitting field transistor (LFET) is a top gate transistor.

17. An optoelectronic device as claimed in claim 1 wherein said a light-emitting field transistor (LFET) has a gate electrode comprising silver gate metal.

* * * * *